(12) United States Patent
Murch et al.

(10) Patent No.: US 11,102,918 B2
(45) Date of Patent: Aug. 24, 2021

(54) ELECTROMAGNETIC PULSE/HIGH ALTITUDE ELECTROMAGNETIC PULSE (EMP/HEMP) FILTER SYSTEM

(71) Applicant: Technical Sales Solutions, LLC, Weare, NH (US)

(72) Inventors: Terence Murch, Weare, NH (US); Thomas Griffin, Gibsonia, PA (US); Kenneth W Ogden, Santa Ana, CA (US)

(73) Assignee: Technical Sales Solutions, LLC, Weare, NH (US)

( * ) Notice: Subject to any disclaimer, the term of this patent is extended or adjusted under 35 U.S.C. 154(b) by 231 days.

(21) Appl. No.: 16/253,882

(22) Filed: Jan. 22, 2019

(65) Prior Publication Data

US 2019/0230828 A1    Jul. 25, 2019

Related U.S. Application Data

(60) Provisional application No. 62/620,522, filed on Jan. 23, 2018.

(51) Int. Cl.
*H05K 9/00* (2006.01)
*H01R 25/16* (2006.01)

(52) U.S. Cl.
CPC ......... *H05K 9/0066* (2013.01); *H01R 25/162* (2013.01); *H05K 9/0009* (2013.01); *H05K 9/0015* (2013.01)

(58) Field of Classification Search
None
See application file for complete search history.

(56) References Cited

U.S. PATENT DOCUMENTS

| | | | | |
|---|---|---|---|---|
| 10,291,145 | B2* | 5/2019 | Friedlund | H05K 7/1432 |
| 2010/0208433 | A1* | 8/2010 | Heimann | H04Q 1/03 361/724 |
| 2011/0235557 | A1* | 9/2011 | Jian | H03H 9/547 370/282 |
| 2015/0098257 | A1* | 4/2015 | Wei | H02M 5/4585 363/37 |
| 2016/0294430 | A1* | 10/2016 | Wu | H04B 1/3888 |

\* cited by examiner

*Primary Examiner* — Jeffrey A Gblende
(74) *Attorney, Agent, or Firm* — Bourque & Associates PA

(57) ABSTRACT

A filter design configured to operate in the medium voltage range of 1000 to 5000 volts, provides protection against Electromagnetic Pulse/High Altitude Electromagnetic Pulse (EMP/HEMP) intentional electromagnetic interference pulses. The filter utilizes no oil filled components to preclude the catastrophic failures (explosions) during operation. Many of the components incorporated in the present design are suited to absorbing harmonics without failing. In addition to mitigating E1 and E2 pulses, the filter is resistant to line harmonics which have proved to cause filter failure in past designs. The filter provides EMP/HEMP conducted pulse protection for downstream electronics inside hardened shelters for medium and high voltage applications.

10 Claims, 8 Drawing Sheets

ELECTROMAGNETIC PULSE/HIGH ALTITUDE ELECTROMAGNETIC PULSE (EMP/HEMP) FILTER SYSTEM

CROSS REFERENCE TO RELATED APPLICATION

This application claims priority to U.S. Patent Application No. 62/620,522 filed on Jan. 23, 2018 entitled "ELECTROMAGNETIC PULSE/HIGH ALTITUDE ELECTROMAGNETIC PULSE (EMP/HEMP) FILTER SYSTEM", which is incorporated fully herein by reference.

FIELD OF THE INVENTION

The present invention relates to a filter to protect electronics and more particularly, relates to a filter to protect electronics from electrical pulses that have been generated from a directed energy device, nuclear/chemical weapon or from intense solar weather.

BACKGROUND OF THE INVENTION

Electromagnetic Pulse (EMP) is an instantaneous, intense energy field that can overload or disrupt at a distance numerous electrical systems and high technology microcircuits, which are especially sensitive to power surges. A large scale EMP effect can be produced by a single nuclear explosion detonated high in the atmosphere. This method is referred to as High-Altitude EMP (HEMP). A similar, smaller-scale EMP effect can be created using non-nuclear devices with powerful batteries or reactive chemicals. This method is called High Power Microwave (HPM). Several nations, including reported sponsors of terrorism, may currently have a capability to use EMP as a weapon for cyber warfare or cyber terrorism to disrupt communications and other parts of the U.S. critical infrastructure or critical infrastructure of other countries. Also, some equipment and weapons used by the U.S. military may be vulnerable to the effects of EMP.

Electromagnetic energy, characterized as weapon potentially threatening to national security, can be created as a pulse traditionally by two methods: overhead nuclear burst and microwave emission. High-Altitude Electromagnetic Pulse (HEMP) is a near-instantaneous electromagnetic energy field that is produced in the atmosphere by the power and radiation of a nuclear explosion, and that is damaging to electronic equipment over a very wide area, depending on power of the nuclear device and altitude of the burst. High-Power Microwave (HPM) electromagnetic energy can be produced as a near-instantaneous pulse created through special electrical equipment that transforms battery power, or powerful chemical reaction or explosion, into intense microwaves that are also very damaging to electronics, but within a much smaller area. In addition, while HEMP weapons are large in scale and require a nuclear capability along with technology to launch high altitude missiles, HPM weapons are smaller in scale, and can involve a much lower level of technology that may be more easily within the capability of some extremist groups.

HPM can cause damage to computers similar to HEMP, although the effects are limited to a much smaller area. Description of High-Altitude Electromagnetic Pulse HEMP is produced when a nuclear weapon is detonated high above the Earth's surface, creating gamma-radiation that interacts with the atmosphere to create an instantaneous intense electromagnetic energy field that is harmless to people as it radiates outward, but which can overload computer circuitry with effects similar to, but causing damage much more swiftly than, a lightning strike.

The effects of HEMP became fully known to the United States in 1962 during a high-altitude nuclear test (code named "Starfish Prime") over the Pacific Ocean, when radio stations and electronic equipment were disrupted 800 miles away throughout parts of Hawaii. The HEMP effect can span thousands of miles, depending on the altitude and the design and power of the nuclear burst (a single device detonated at an appropriate altitude over Kansas reportedly could affect all of the continental United States, and can be picked up by metallic conductors such as wires, or overhead power lines, acting as antennas that conduct the energy shockwave into the electronic systems of cars, airplanes, or communications equipment.

Industry currently supplies low voltage (less than 600 Volts) HEMP (high-altitude electromagnetic pulse) filters to the military which are robust and reliable. Previous EMP/HEMP for medium voltage application (600 Volts to 69 kV) did not meet the reliability levels needed for the application that they were intended for. In many cases the filters suffered catastrophic failure and exploded.

Accordingly, what is needed is a medium voltage EMP/HEMP filter design that precludes or at least significantly minimizes the possibility of explosion and catastrophic failure in medium voltage application EMP/HEMP filters.

SUMMARY OF INVENTION

The filter design of the present invention presented herein uses different technologies to preclude the catastrophic failures experience by industry in the past. The medium voltage filter design utilizes components that are not oil filled so as to preclude or at least significantly minimize explosions and catastrophic failure that were experienced with current prior Art designs.

The present invention relates to protection against Electromagnetic Pulse/High Altitude Electromagnetic Pulse (EMP/HEMP) intentional electromagnetic interference pulses. Specifically the invention addresses these issue in the medium voltage range of 1000 to 5000 volts and is designed to meet Mil-Std-188-125 requirements. Previous filters designed and built to meet requirements in medium voltage applications, as noted in the previous paragraph, have failed catastrophically in operation. The present invention utilizes a different design (no oil filled components) to preclude the catastrophic failures (explosions) during operation. Many of the components incorporated in the present design are suited to absorbing harmonics without failing. In addition to mitigating E1 and E2 pulses the present invention is resistant to line harmonics which have proved to cause filter failure in past designs.

The present invention features an electromagnetic pulse filter system comprising, in a first embodiment, a housing assembly comprising a backing plate, an input compartment, coupled to the backing plate, and configured for coupling to an input electrical circuit, and a plurality of filter elements. Each of the plurality of filter elements coupled to the backing plate and electrically coupled proximate an input connection of each of the plurality of filter elements to the input compartment. The plurality of filter elements further include an output connection, electrically coupled to the filter input connection by means of a plurality of electromagnetic filter elements disposed on a central core of each of the plurality of filter elements. An output compartment is coupled to the backing plate and electrically coupled to the output portion of each of the plurality of filter elements. The output compartment is configured for coupling to an output and electrical circuit.

In another embodiment, the plurality of electromagnetic filter elements on each of the plurality of filter elements comprises a first inductive component, coupled to the input portion of the filter element; a second inductor component, electrically coupled to the first inductive component; a first feedthrough capacitor, electrically coupled to the second inductor component; a first line to ground capacitor, electrically coupled to the feedthrough capacitor; a third inductor component, electrically coupled to the line to ground capacitor; a second line to ground capacitor, electrically coupled to the third inductor component; and a second feedthrough capacitor, electrically coupled to the second line to ground capacitor and to the output connection of the filter element.

In the preferred embodiment, the input connection on each of the plurality of filter elements includes a first busbar connector, and wherein the output connection on each of the plurality of filter elements includes a second busbar connector. In this embodiment, the first busbar connector and the second busbar connector of each of the plurality of filter elements are swaged to the central core of each of the plurality of filter elements. Further, the first busbar connector may include a surge arrestor.

The plurality of filter elements are preferably disposed in a central compartment located between the input compartment and the output compartment. The quantity of the plurality of filter elements is selected based on the input electrical circuit configuration which may be selected from the configurations consisting of a Delta configuration and a Wye configuration.

In a further embodiment, the first inductive component is selected from the group of inductive components consisting of and open loop core inductive component and an air core inductive component.

In another configuration, the electromagnetic pulse filter system according to one feature of the present invention comprises a housing assembly comprising a backing plate, an input compartment, coupled to the backing plate, and configured for coupling to an input electrical circuit, and a plurality of filter elements. Each of the plurality of filter elements are coupled to the backing plate and electrically coupled proximate an input connection of each of the plurality of filter elements to the input compartment. The plurality of filter elements further include an output connection, electrically coupled to the filter input connection by means of a plurality of electromagnetic filter elements disposed on a central core of each of the plurality of filter elements. An output compartment is coupled to the backing plate and electrically coupled to the output portion of each of the plurality of filter elements. The output compartment is configured for coupling to an output and electrical circuit. The plurality of electromagnetic filter elements of each of the plurality of filter elements comprises a first inductive component, coupled to the input portion of the filter element; a second inductor component, electrically coupled to the first inductive component; a first feedthrough capacitor, electrically coupled to the second inductor component; a first line to ground capacitor, electrically coupled to the feedthrough capacitor; a third inductor component, electrically coupled to the line to ground capacitor; a second line to ground capacitor, electrically coupled to the third inductor component; and a second feedthrough capacitor, electrically coupled to the second line to ground capacitor and to the output connection of the filter element.

In yet another embodiment, the electromagnetic pulse filter system according to this embodiment comprises a housing assembly comprising a backing plate, an input compartment, coupled to the backing plate, and configured for coupling to an input electrical circuit, a plurality of filter elements, each of the plurality of filter elements coupled to the backing plate and electrically coupled proximate an input connection of each of the plurality of filter elements to the input compartment, the plurality of filter elements further including an output connection, electrically coupled to the filter input connection by means of a plurality of electromagnetic filter elements disposed on a central core of each of the plurality of filter elements, wherein the input connection on each of the plurality of filter elements includes a first busbar connector swaged onto the central core of each of the plurality of filter elements, and wherein the output connection on each of the plurality of filter elements includes a second busbar connector swaged onto the central core of each of the plurality of filter elements, and wherein each of the first busbar connectors includes a surge arrestor. An output compartment is coupled to the backing plate and electrically coupled to the output portion of each of the plurality of filter elements, the output compartment configured for coupling to an output and electrical circuit.

The plurality of electromagnetic filter elements of each of the plurality of filter elements may comprise a first inductive component, coupled to the input portion of the filter element; a second inductor component, electrically coupled to the first inductive component; a first feedthrough capacitor, electrically coupled to the second inductor component; a first line to ground capacitor, electrically coupled to the feedthrough capacitor; a third inductor component, electrically coupled to the line to ground capacitor; a second line to ground capacitor, electrically coupled to the third inductor component; and a second feedthrough capacitor, electrically coupled to the second line to ground capacitor and to the output connection of the filter element.

The present invention therefore provides EMP/HEMP conducted pulse protection for downstream electronics inside hardened shelters for medium and high voltage applications. The basis for this invention is to use the latest component technology, and to apply unique configurations to meet the stated objectives.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Figure 1:
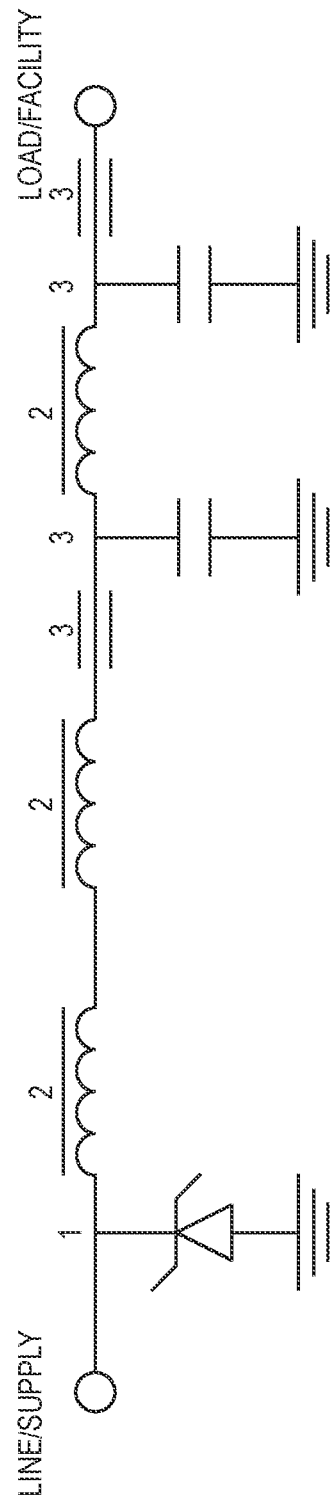
FIG. 1 is a prior art hemp suppression circuit.

FIG. 1 illustrates a typical prior art HEMP filter configuration. Component type, value and placement determines performance and reliability. Such prior art EMP/HEMP filters for medium voltage application (600 Volts to 69 kV) did not meet the reliability levels needed for the application that they were intended for. In many cases the filters suffered catastrophic failure and exploded.

Figure 2:
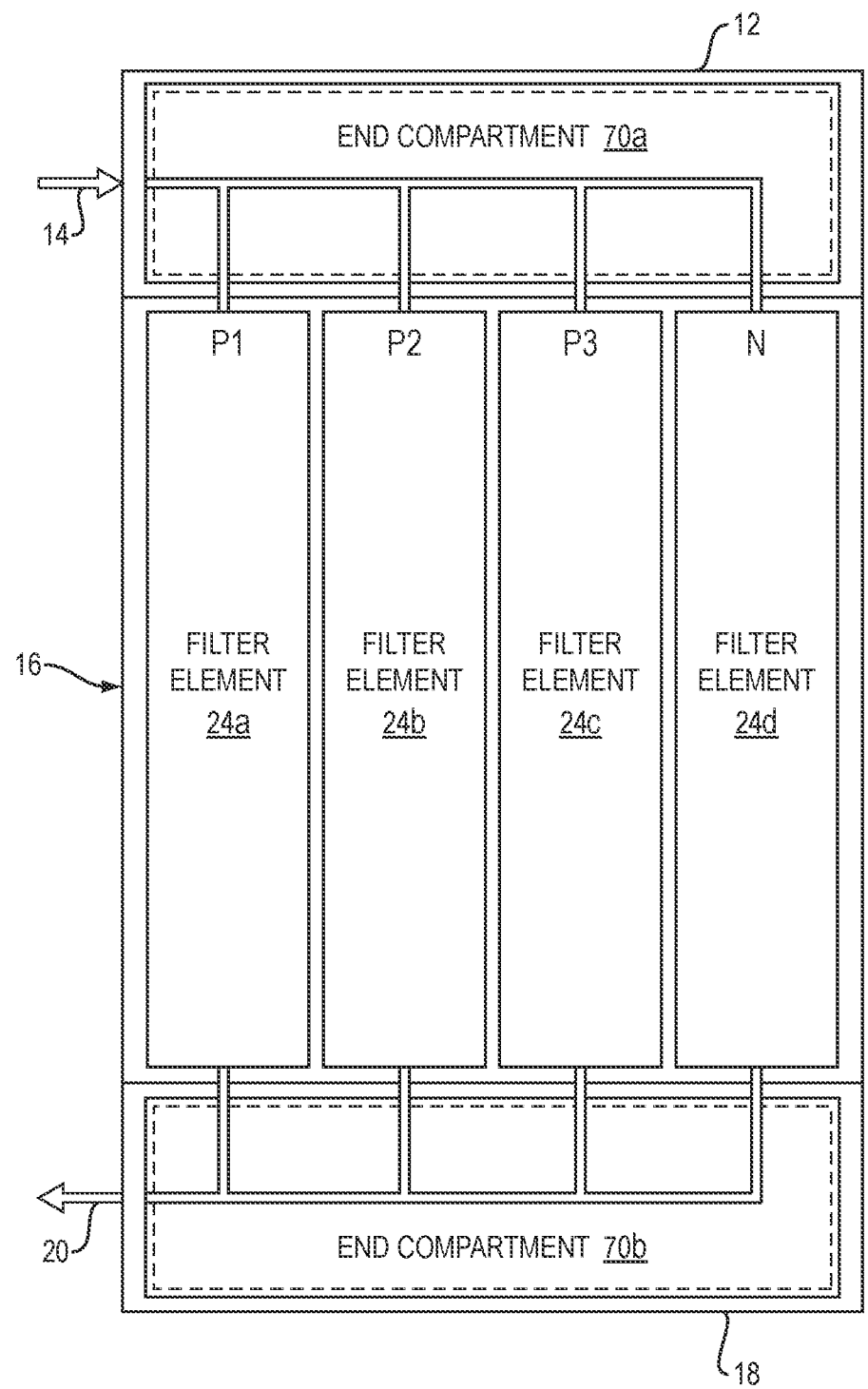
FIG. 2 is a front view of a representation of a hemp filter housing assembly according to one embodiment of the present invention.
Figure 3:
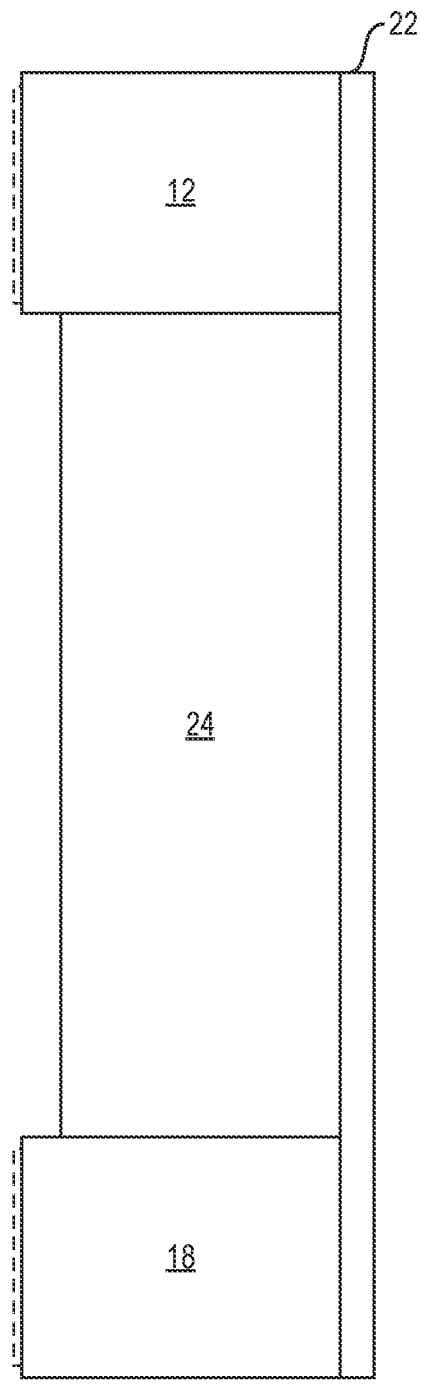
FIG. 3 is a side view of the hemp filter housing assembly of FIG. 2.

The HEMP housing 10, FIG. 2, according to the present invention is preferably constructed from 316 stainless steel and configured typical of individual input powerline HEMP filters with three compartments: the Input or dirty side compartment 12 providing connections to the input power 14; a central section compartment 16 which houses the individual filter compartments; and the output or clean side compartment 18 providing connections 20 for filtered output power. The complete housing 10 is of a three section construction 12, 16 and 18, constructed of four primary elements, namely, a backing plate 22, FIG. 3 which provides the support for the two end caps or compartments 12, 18 and the three or four filter elements 16 required for the system. The present design does not use any oil filled components and is designed to keep voltage drop, heat dissipation to a minimum as well as the ability to withstand external harmonics and issues attributed to variable frequency drives. The present invention provides HEMP pulse protection for medium (600 Volts to 6900 Volts) and high voltage (15,000 volts to 23,000 volts) applications meeting the requirements of Mil-Std-188-125.

Each filter end compartment 12, 18 provides protection and shielding for the filter cable interconnects, and is constructed to provide 80 Db of shielding effectiveness and mounted, depending on orientation at the top and bottom or to the end of the filter assembly. The center or filter portion 16 is comprised of three or four individual filter elements 24 depending on whether the electrical configuration is Delta or Wye. Each filter element section 24a-24d will house the filter components (described in greater detail below) and will mount axially into the filter end compartments 12, 18.

Figure 4:
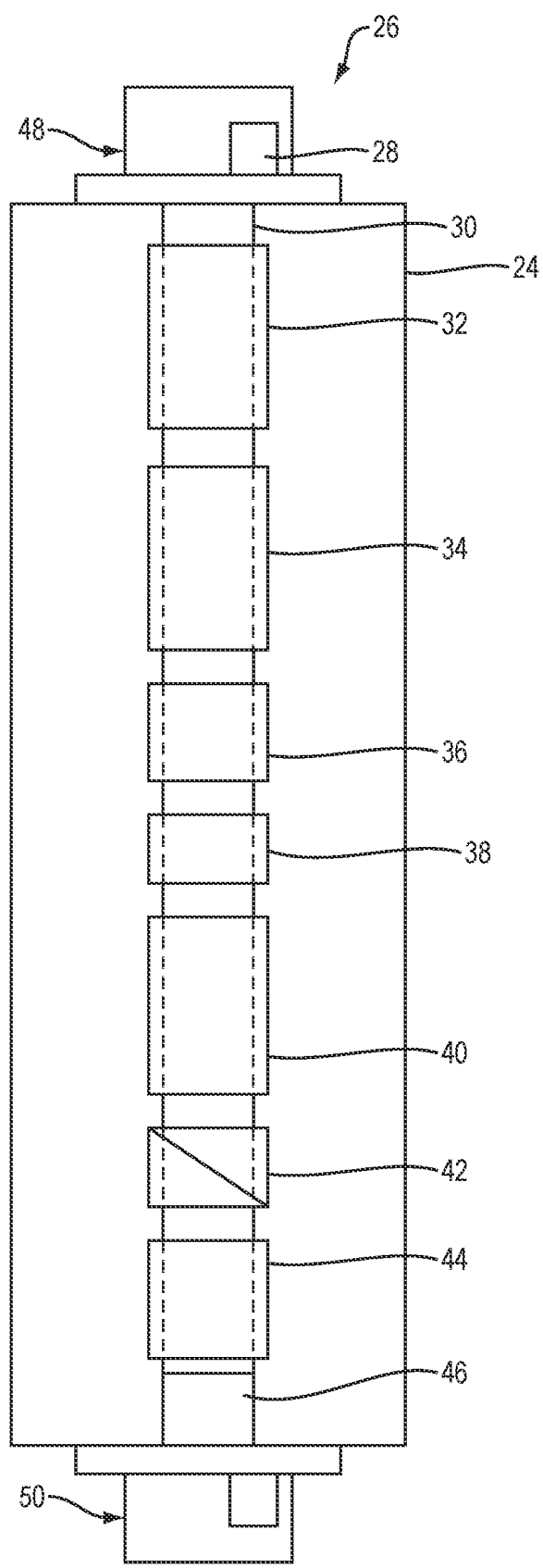
FIG. 4 is a schematic representation of the internal configuration and components of a filter element of the hemp filter according to the present invention.

Components in the filter housings will consist of the busbar 26, FIG. 4 each busbar 26 having a surge arrestor 28, proximate a first input end cap 48 of the busbar, an input insulator 30, inductive input 32, inductor 34, feed-through capacitor (cap) 36, Line to Ground (L-G) capacitor 38, inductor 40, L-G cap 42, feed-through capacitor 44 and output insulator 46. Each filter element 24 will mount between the end caps 48, 50 to shield the busbars 26 from human contact and provide shielding effectiveness at the electrical connections. Each input and output compartment 12, 18 will be separate from the filter elements 32-44. The filter elements 32-44 will bolt onto the end caps 48, 50 with EMI gasket material filling gaps to prevent EMC leakage. There will be solid EMC proof barriers described in greater detail below between the end compartments 12, 18 and the filter elements 32-44 to insure electrical signal isolation to preclude any path for the pulse to follow. Access holes for the filters and bolt holes where each filter element will be bolted to the clean and dirty side end caps 48, 50 will be preferably sealed using a Kemtron or similar gasket material. Each end cap 48/50 shall be of sufficient size to accommodate conductor sweeps and conduct maintenance on the filters.

Figure 5B:
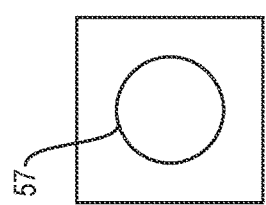
FIG. 5B is a top view of the air core bus design of FIG. 5A.
Figure 5C:
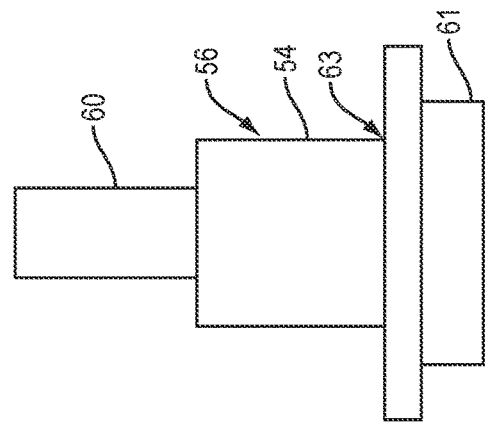
FIG. 5C is a close-up view of one and of the air core bus design of FIG. 5A.
Figure 5A:
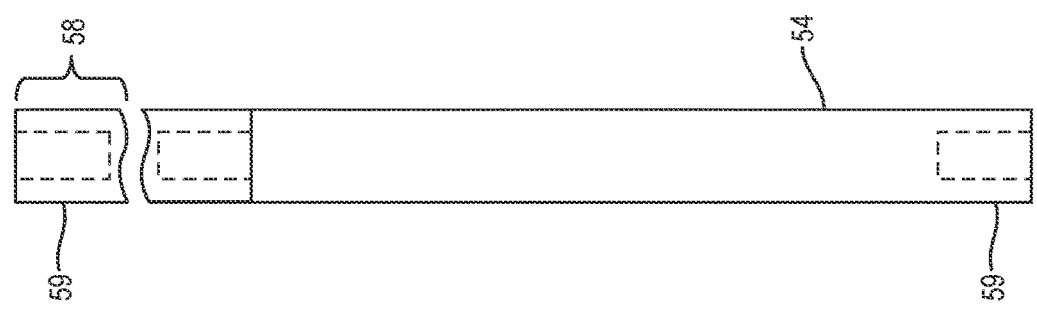
FIG. 5A is a schematic view of an air core bus design according to one feature of the present invention.

The busbar configuration 52, FIG. 5A-5C shall be a three piece copper construction. The center portion 54 of the busbar will be constructed of 2"×2" square copper per ASTM standards and the connection ends 59 will be circular or square approximately 2 inches in length and 1" in diameter. The busbar size will be larger than required to handle the ampacity and keeping heat rise to a minimum. The invention preferably includes a 2" square copper bar as the center portion 54 with both ends 56 swaged into position.

The center section 54 shall have a 1 inch diameter bore 57, FIG. 5B by 2" deep 58 FIG. 5A. Following assembly of the components on the central section 54 of the busbar, the rectangular ends 56 FIG. 5C will be pressed into place and swaged to effectively create a one piece construction. Rectangular ends 56 will have a 4" long by 3" wide by 1" thick "blade" with a male 1" diameter by 1.99 inch long cylindrical extension 60 that will be pressed into the female circular ends 57 of the central, square bus bar 54. After the ends 56 of the bus bar have been installed, the interface area 63 between ends 56 and center portion of the bus bar 54 will be swaged to make a permanent connection point.

On the input end 48 of the filter elements 24, surge arrestors 28 are mounted on the housing end next to the main power busbar end and are electrically connected through a small busbar. Input power cable connections made to the main busbar end as specified by the customer.

Figure 8:
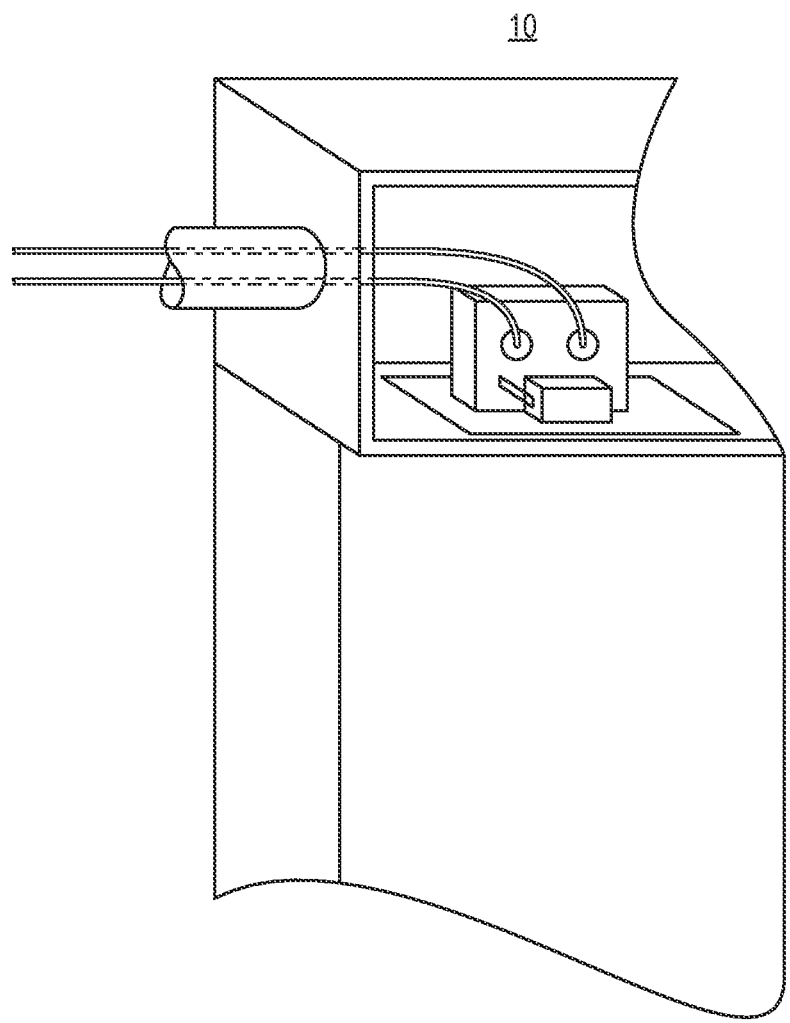
FIG. 8 is a perspective view of the electromagnetic pulse/high altitude electromagnetic pulse filter system according to the present invention.

The compartment itself 10 (FIGS. 2 and 8) will be constructed with an access cover 70a and 70b held in place by bolts on 2" centers. When the cover 70 is in place, the compartment 12/18 is closed with an EMC gasket in place to preclude ingress or egress of an external pulse through the access opening.

The center section 24 of the filter assembly will contain the filter elements 32-44, which is the housing for the filter components. This compartment is completely insulated and isolated from the input and output sides and compartments of the filter.

Output compartment 18 contains the clean cable connections 20. The compartment itself 18 will be constructed with an access cover 70b held in place by bolts on 2" centers for example. When the cover 70b is in place, the compartment 18 is closed with an EMC gasket in place to preclude ingress of an external pulse through the access opening. The input and output compartments will be identical in design and construction and are interchangeable.

Starting at the input side 48, this section will provide a detailed description of the filter components. Placement of the components will be a key feature in the successful performance of this invention, since the magnetic fields from each component will interact. FIG. 4 illustrates an example of the location of components on the main busbar, but actual spacing and orientation/position may vary and be adjusted and can be determined during testing as well known to those skilled in the art.

Surge arrestors 28 will be placed on the power input end 48 of each filter. Several technologies may be utilized to clamp the voltage surge into the filter. Currently the primary design will use MOVs (metal oxide varistors). Other surge arrestor technology that may be utilized include but are not limited to: MOVs; Transient Suppression Diodes; IGBT; and Gas Tube.

Figure 6:
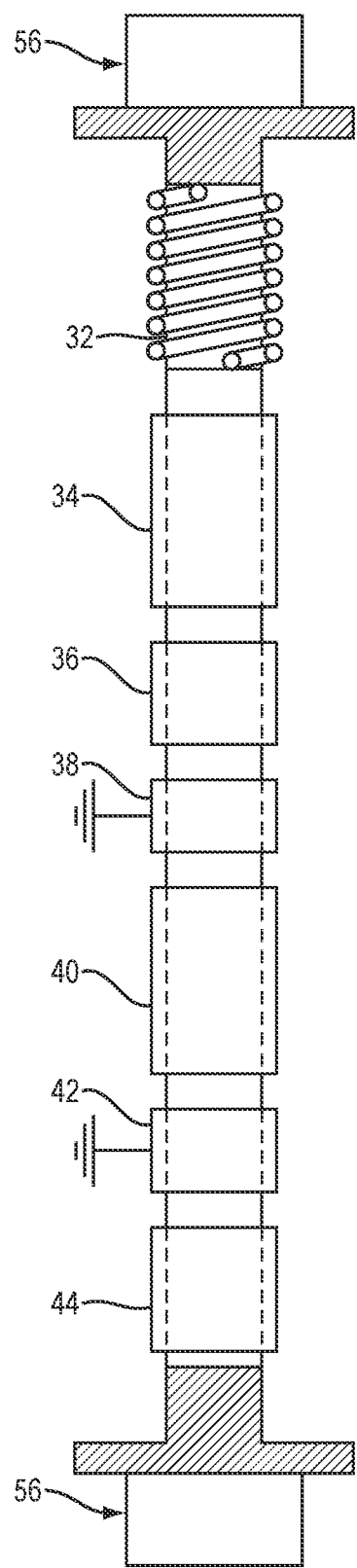
FIG. 6 is a side schematic view of an air core inductive input according to one feature of the present invention.
Figure 7:
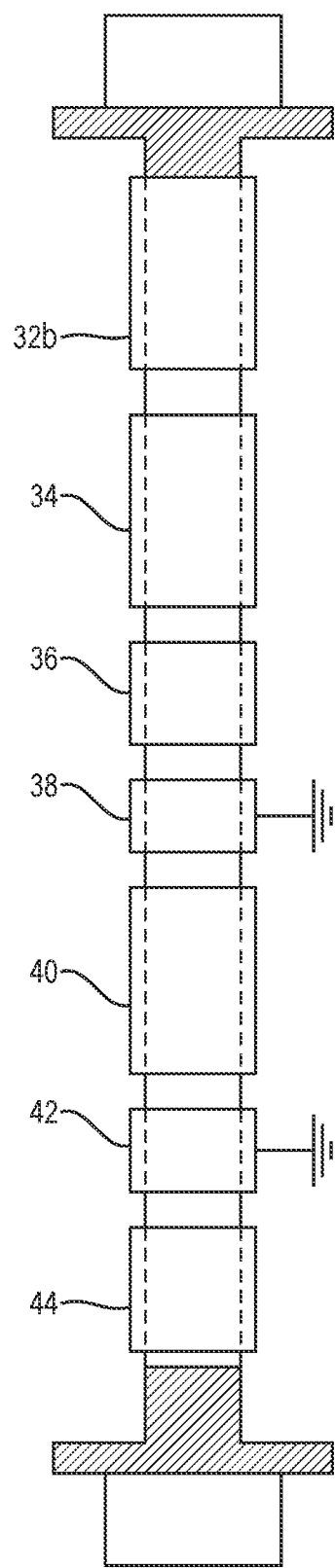
FIG. 7 is a side schematic view of an open loop core inductive input according to another feature of the present invention.

An inductive input 32 will preferably be the first component at the power input of each filter and will provide the resistance to trigger the surge arrestor taking the initial surge to ground. The surge arrestor 28 is not sufficient on its own to protect the downstream electronics. An inductive input comprising an air core 32a (see FIG. 6) or open loop magnetic core 32b (see FIG. 7) (1 to 5 micro H range) as a starting point will be evaluated for peak performance during further testing.

A second inductor 34 will be required to meet the shielding effectiveness requirements of Mil-Std-188-125. Performance to meet this requirement will require an inductance rating of 10 to 100 micro Henrys. Gap magnetic core inductors, which may include powdered iron, MPP cores, Kool-μ, high flux and silicon-steel cores are the main types of inductors contemplated in this design. These high permeability cores will provide the performance necessary to meet shielding effectiveness and to help suppress any portion of the pulse that enters the filter element. Inductor design will be done to preclude core saturation at any point lower than 130% of the rated current.

Feed-through capacitors 36 provide shielding effectiveness at the higher frequencies of 10 MHz to 18 GHz. Capacitor selection will be in the 10 nF to 100 nF range to reach the performance necessary. Feed-through capacitors will be constructed of metalized film winding mounted directly onto the busbar 54 through an insulted (nomex, Teflon, nylon, etc.) core with ferrous end plates. This style cap will be self-healing to achieve the highest level of longevity and reliability.

Line to ground pulse type capacitors 38 will be used to address lower frequency noise of 10 KHz through 10 MHz. These capacitors will mitigate harmonics that have the potential to damage traditional medium voltage filter designs. The capacitor 38 will be constructed from metalized film and will be self-healing to achieve the highest level of longevity and reliability.

Inductor 40, line-to-ground capacitor 42 and feed-through capacitor 44 are designed as and share the same characteristics as the comparable elements 34, 36 and 38.

Wire interconnect from the filter power output to the shielded volume will be made to each filter element bus bar in the clean side (power output) compartment 18. The compartment will be sealed against HEMP/EMP. The customer will be responsible for conduits into the shielded volume.

Modifications and substitutions by one of ordinary skill in the art are considered to be within the scope of the present invention, which is not to be limited except by the allowed claims and their legal equivalents.

What is claimed is:

1. An electromagnetic pulse filter system, comprising: a housing assembly comprising:
   a backing plate;
   an input compartment, mechanically coupled to said backing plate, and configured for coupling to an input electrical circuit;
   a plurality of filter elements, each of said plurality of filter elements having an input connection, an output connection and a plurality of electromagnetic filter elements disposed on a central core, each of said plurality of filter elements mechanically coupled to said backing plate and electrically coupled proximate said input connection of each of said plurality of filter elements to said input compartment, said output connection of each of said plurality of filter elements electrically coupled to a respective filter element input connection by means of said plurality of electromagnetic filter elements disposed on said central core of each said respective filter element; and
   an output compartment, mechanically coupled to said backing plate and electrically coupled to said output connection of each of said plurality of filter elements, said output compartment configured for coupling to an output electrical circuit.

2. The electromagnetic pulse filter system according to claim 1, wherein said plurality of electromagnetic filter elements on each of said plurality of filter elements comprises:
   a first inductive component, coupled to said input connection of each of said plurality of filter elements;
   a second inductor component, electrically coupled to said first inductor component;
   a first feedthrough capacitor, electrically coupled to said second inductor component;
   a first line to ground capacitor, electrically coupled to said first feedthrough capacitor;
   a third inductor component, electrically coupled to said first line to ground capacitor;
   a second line to ground capacitor, electrically coupled to said third inductor component; and
   a second feedthrough capacitor, electrically coupled to said second line to ground capacitor and to said output connection of each of said plurality of filter elements.

3. The electromagnetic pulse filter system according to claim 1, wherein input connection on each of said plurality of filter elements includes a first busbar connector, and wherein said output connection on each of said plurality of filter elements includes a second busbar connector.

4. The electromagnetic pulse filter system according to claim 3, wherein said first busbar connector and said second busbar connector of each of said plurality of filter elements are swaged to said central core of each of said plurality of filter elements.

5. The electromagnetic pulse filter system according to claim 3, wherein said first busbar connector includes a surge arrestor.

6. The electromagnetic pulse filter system according to claim 1, wherein said plurality of filter elements are disposed in a central compartment located between said input compartment and said output compartment.

7. The electromagnetic pulse filter system of according to claim 1, wherein a quantity of said plurality of filter elements is selected based on said input electrical circuit configuration.

8. The electromagnetic pulse filter system according to claim 7, wherein said input electrical circuit is selected from a group of circuit configurations consisting of a Delta configuration and a Wye configuration.

9. The electromagnetic pulse filter system according to claim 2, wherein said first inductive component is selected from a group of inductive components consisting of and open loop core inductive component and an air core inductive component.

10. An electromagnetic pulse filter system, comprising: a housing assembly comprising:
   a backing plate;
   an input compartment, mechanically coupled to said backing plate, and configured for coupling to an input electrical circuit;
   a plurality of filter elements, each of said plurality of filter elements having an input connection, an output connection and a plurality of electromagnetic filter elements disposed on a central core, each of said plurality of filter elements mechanically coupled to said backing plate and electrically coupled proximate said input connection of each of said plurality of filter elements to said input compartment, said output connection of each of said plurality of filter elements electrically coupled to a respective filter element input connection by means of said plurality of electromagnetic filter elements disposed on said central core of each said respective filter element, wherein said input connection on each of said plurality of filter elements includes a first busbar connector swaged onto said central core of each of said plurality of filter elements, and wherein said output connection on each of said plurality of filter elements includes a second busbar connector swaged onto said central core of each of said plurality of filter elements, and wherein each of said first busbar connectors includes a surge arrestor; and an output compartment, mechanically coupled to said backing plate and electrically coupled to said output connection of each of said plurality of filter elements, said output compartment configured for coupling to an output electrical circuit; and wherein said plurality of electromagnetic filter elements of each of said plurality of filter elements comprises:

a first inductor component, coupled to said input connection of each of said plurality of filter elements;

a second inductor component, electrically coupled to said first inductor component;

a first feedthrough capacitor, electrically coupled to said second inductor component;

a first line to ground capacitor, electrically coupled to said first feedthrough capacitor; a third inductor component, electrically coupled to said first line to ground capacitor;

a second line to ground capacitor, electrically coupled to said third inductor component; and a second feedthrough capacitor, electrically coupled to said second line to ground capacitor and to said output connection of each of said plurality of filter elements.

* * * * *